United States Patent
Shidla et al.

(10) Patent No.: US 8,176,250 B2
(45) Date of Patent: May 8, 2012

(54) SYSTEM AND METHOD FOR TESTING A MEMORY

(75) Inventors: Dale J. Shidla, Roseville, CA (US);
Andrew H. Barr, Roseville, CA (US);
Ken G. Pomaranski, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1680 days.

(21) Appl. No.: 10/652,536

(22) Filed: Aug. 29, 2003

(65) Prior Publication Data
US 2005/0050276 A1    Mar. 3, 2005

(51) Int. Cl.
*G06F 12/00* (2006.01)
(52) U.S. Cl. ......... 711/118; 711/104; 714/718; 714/719
(58) Field of Classification Search ........................ None
See application file for complete search history.

(56) References Cited

U.S. PATENT DOCUMENTS

| | | | |
|---|---|---|---|
| 5,274,645 A | 12/1993 | Idleman et al. | |
| 5,381,544 A * | 1/1995 | Okazawa et al. | 714/5 |
| 5,396,619 A | 3/1995 | Walton | |
| 5,410,545 A * | 4/1995 | Porter et al. | 714/723 |
| 5,463,767 A * | 10/1995 | Joichi et al. | 714/37 |
| 5,495,491 A * | 2/1996 | Snowden et al. | 714/764 |
| 5,721,828 A | 2/1998 | Frisch | |
| 5,835,704 A * | 11/1998 | Li et al. | 714/42 |
| 5,867,642 A | 2/1999 | Vivio et al. | |
| 5,937,367 A | 8/1999 | Eckardt | |
| 6,058,047 A * | 5/2000 | Kikuchi | 365/185.33 |
| 6,182,162 B1 | 1/2001 | Estakhri et al. | |
| 6,353,870 B1 | 3/2002 | Mills et al. | |
| 6,363,502 B1 | 3/2002 | Jeddeloh | |
| 6,393,545 B1 | 5/2002 | Long et al. | |
| 6,438,638 B1 | 8/2002 | Jones et al. | |
| 6,453,398 B1 * | 9/2002 | McKenzie | 711/165 |
| 6,523,135 B1 | 2/2003 | Nakamura | |
| 6,931,582 B2 * | 8/2005 | Tamura et al. | 714/758 |
| 2001/0025359 A1 * | 9/2001 | Tanaka | 714/753 |
| 2003/0065470 A1 | 4/2003 | Maxham | |
| 2003/0125908 A1 | 7/2003 | Wynn et al. | |
| 2004/0024970 A1 | 2/2004 | Chauvel et al. | |
| 2004/0068679 A1 | 4/2004 | Vellolil et al. | |
| 2004/0143719 A1 | 7/2004 | Nguyen et al. | |
| 2004/0169885 A1 | 9/2004 | Mellor et al. | |
| 2005/0044467 A1 | 2/2005 | Leung et al. | |

FOREIGN PATENT DOCUMENTS

JP    2000-222236    8/2000

OTHER PUBLICATIONS

David A. Patterson and John L. Hennessy, Computer Architecture a Quantitative Approach, 1996, Morgan Kaufmann Publishers, Inc, Second Edition, pp. 375-381.*
GB Search Report for Application No. GB0418973.4 mailed on Dec. 13, 2004 (3 pages).

* cited by examiner

*Primary Examiner* — Shawn X Gu (57) ABSTRACT

A computer system comprising a processor, a memory, and a memory controller coupled to the processor and the memory is provided. The memory controller comprises a first cache and a cache control. The cache control is configured to cause a portion of the memory to be copied into the first cache. The cache control is configured to cause first information to be provided from the first cache to the processor in response to receiving a read transaction from the processor that includes an address in the portion of memory during testing of the portion.

19 Claims, 6 Drawing Sheets

SYSTEM AND METHOD FOR TESTING A MEMORY

BACKGROUND

Computer systems generally include one or more processors and a memory system. The memory system often includes multiple levels of memory devices that range from relatively fast and expensive memory to relatively slow and inexpensive memory. One of the first levels of a memory system is referred to as main memory usually comprises some form of Random Access Memory (RAM). In operation, a computer system loads an operating system and one or more applications into the main memory so that they may be executed by the processor(s).

Because the main memory contains the operating system and applications, it can be a critical component of the computer system. Failures that occur in the main memory can cause broader failures to occur in the system and possibly cause the system to crash. As a result, it is generally desirable to detect errors in the main memory before they cause failures.

Memory errors may be detected by writing known information to a memory and then reading the information back to determine whether it is correct. Some memory errors, however, may be pattern sensitive and may only appear in response to selected information patterns being written to the memory. Some diagnostic testing of a memory may occur in response to a computer system being turned on or reset. This type of testing, however, may not detect errors in computer systems that are left on and not reset for extended periods of time.

Although some memory devices include error correction features that work during operation of a computer system, these features typically detect errors only in response to a specific memory location being read. Because many areas of a memory may not be read with regularity, errors that occur in these areas may go undetected until an access to a faulty memory location takes place.

Accordingly, it would be desirable to be able to detect errors in all areas of a main memory of a computer system before the errors cause failures to occur during operation of the system.

SUMMARY

According to one exemplary embodiment, a computer system comprises a processor, a memory, and a memory controller coupled to the processor and the memory. The memory controller comprises a first cache and a cache control. The cache control is configured to cause a portion of the memory to be copied into the first cache. The cache control is configured to cause first information to be provided from the first cache to the processor in response to receiving a read transaction from the processor that includes an address in the portion of memory during testing of the portion.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

In one aspect of the present disclosure, a memory controller includes a cache to allow the memory of a computer system to be tested during operation of the computer system. Information from a portion of the memory is copied into the cache and an operating system and/or a test module causes tests to be performed on the portion of the memory. During the tests, the memory controller directs accesses to the portion of the memory to the information stored in the cache. After the tests are complete, the information is copied from the cache back into the portion of the memory.

Figure 1:
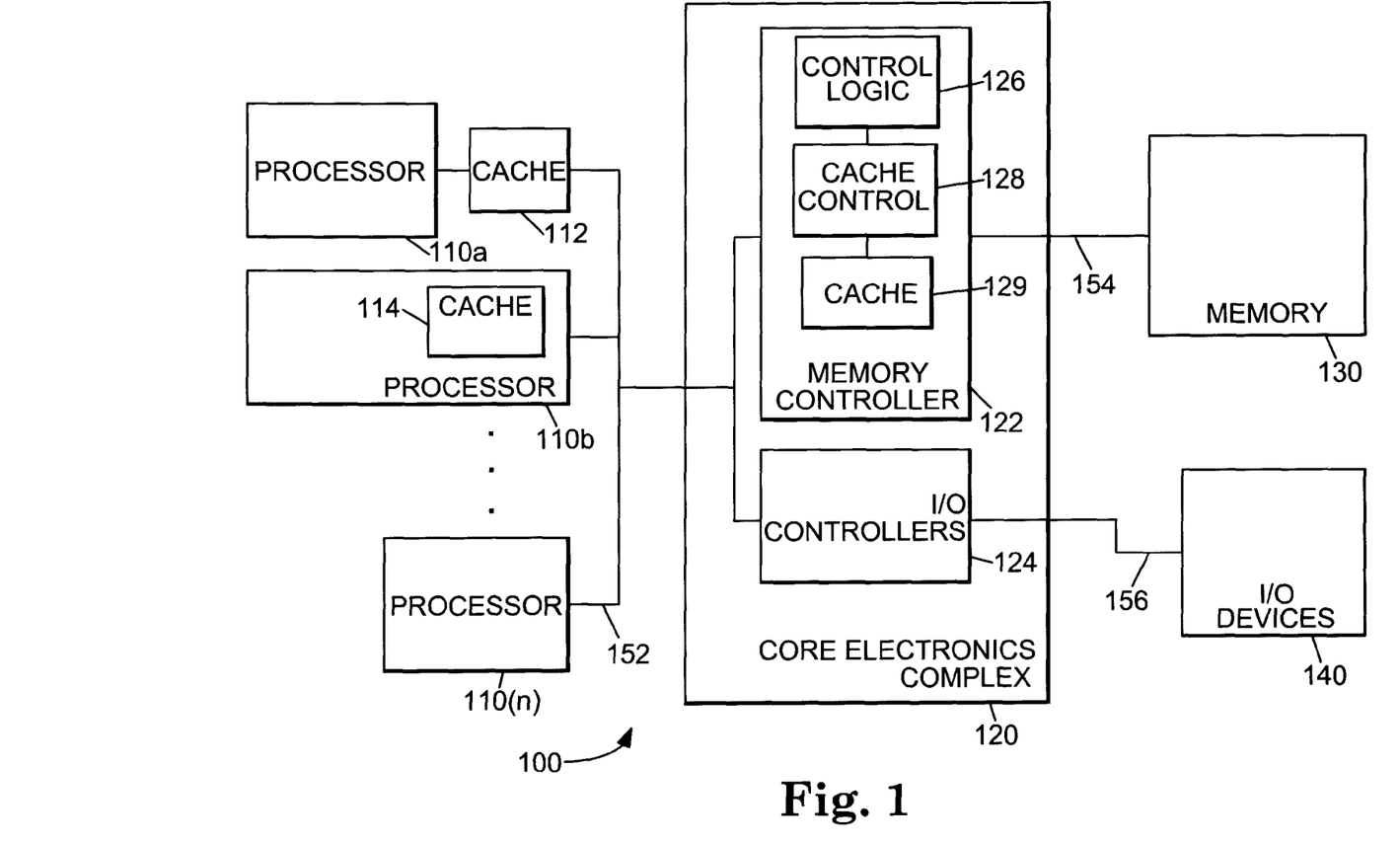
FIG. 1 is a block diagram illustrating an embodiment of a computer system with a memory controller that includes a cache.

FIG. 1 is a block diagram illustrating an embodiment of a computer system 100 with a memory controller 122 that includes a cache 129. Computer system 100 may be any type of computer system such as desktop, notebook, mobile, workstation, or server computer. Computer system 100 includes processors 110a through 110(n), a core electronics complex 120, a memory 130, and a set of input/output (I/O) devices 140. Processors 110a through 110(n) are each coupled to core electronics complex 120 using connections 152. Core electronics complex 120 is coupled to memory 130 and I/O devices 140 using connections 154 and 156, respectively.

Computer system 110a includes any number of processors 110 greater than or equal to one. As used herein, 'processor 110' refers to any one of processors 110a through 110(n), and 'processors 110' refers to the set of processors 110a through 110(n).

Processor 110a is coupled to a cache 112, and processor 110b includes a cache 114. Caches 112 and 114 may store any type of information such as instructions and data. Other processors 110 may include or be operable with any type or number of caches.

Computer system 100 also includes an operating system (not shown) that is executable by one or more of processors 110. Processors 110 execute instructions from the operating system and other programs using memory 130.

Core electronics complex 120 includes memory controller 122 and I/O controllers 124. Memory controller 122 includes control logic 126, a cache control unit 128, and a cache 129. Control logic 126 is configured to operate memory 130 in response to transactions from processors 110 and I/O devices 140. Cache 129 is configured to store information from memory 130 to allow memory 130 to be tested during operation of computer system 100, and cache control unit 128 is configured to control the use and operation of cache 129 in response to the operating system and/or a test module as described in additional detail below. The size of cache 129 may be selected according to the maximum size of memory 130, the memory page size for computer system 100, and memory access times among other factors.

I/O controllers 124 may include any type and number of controllers configured to manage one or more I/O devices 140. Examples of I/O controllers 124 include IDE controllers, PCI controllers, SCSI controllers, USB controllers, IEEE 1394 (Firewire) controllers, PCMCIA controllers, parallel port controllers, and serial port controllers. In one embodiment, I/O controllers 124 comprise multiple microchips that include an I/O controller-to-system bus converter, an intermediate bus coupled to the bus converter, PCI controllers coupled to the intermediate bus, and SCSI, IDE and others controllers coupled to the PCI controllers.

Memory 130 comprises any type of memory managed by memory controller 122 such as RAM, SRAM, DRAM, SDRAM, and DDR SDRAM. In response to commands from system firmware (not shown) or the operating system, memory controller 130 may cause information to be loaded from an I/O device 140 such as a hard drive or a CD-ROM drive into memory 130.

I/O devices 140 may include any type and number of devices configured to communicate with computer system 100 using I/O controllers 124. Each I/O device may be internal or external to computer system 100. I/O devices 140 may include a network device configured to allow computer system 100 to communicate with other computer systems and a storage device configured to store information.

Figure 2:
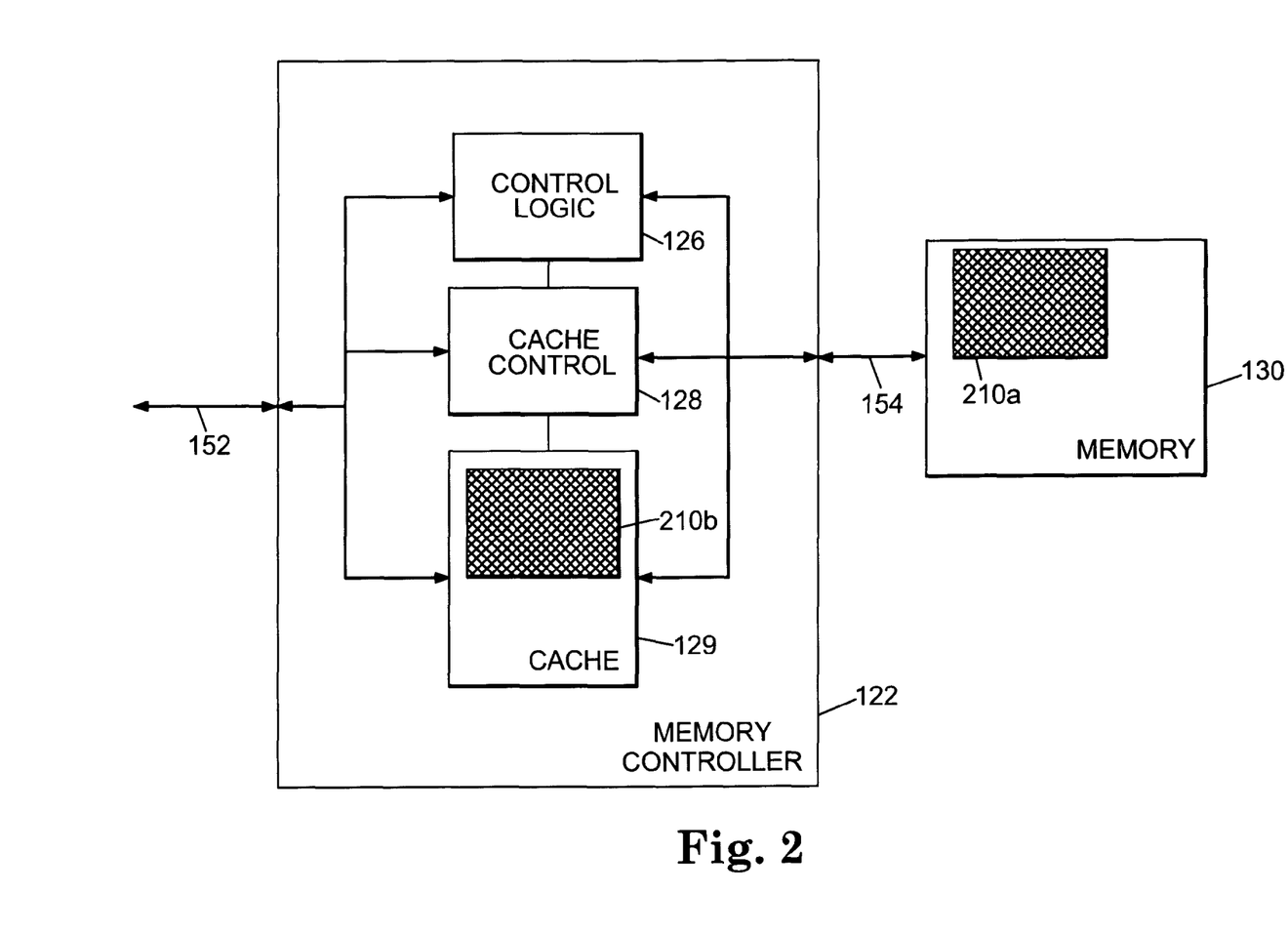
FIG. 2 is a block diagram illustrating a first embodiment of portions of the computer system shown in FIG. 1.

FIG. 2 is a block diagram illustrating a first embodiment of portions of computer system 100 shown in FIG. 1. In the embodiment of FIG. 2, cache 129 is used to test a portion 210a of memory 130 in response to commands from the operating system.

To test portion 210a, the operating system causes the contents of portion 210a to be copied into cache 129 as illustrated by a shaded portion 210b of cache 129. To do so, the operating system selects portion 210a for testing and causes a command to be generated by a processor 110 and provided to memory controller 122 to indicate that portion 210a is to be tested. In response to receiving the command, memory controller 122 causes portion 210a to be copied into cache 129 using control logic 126 and cache control 128. If capable, memory controller 122 may detect, fix, and log errors found in portion 210a in response to copying the contents of portion 210a into cache 129.

During the interval where memory controller 122 is copying the contents of portion 210a into cache 129, memory controller 122 ensures that any regular memory transactions to an address in portion 210a are handled appropriately. For example, if the transaction is a write transaction, memory controller 122 may cause the write associated with the transaction to be performed to both memory 130 and cache 129. Alternatively, memory controller 122 may cause the write to be delayed until the contents of portion 210a are copied into cache 129 and then perform the write only to cache 129. For read transactions, memory controller 122 may perform the read from either memory 130 or cache 129, as appropriate, during this interval.

After the contents of portion 210a are copied into cache 129, memory controller 122 may provide an indication to the operating system that portion 210a is ready for testing. The operating system generates test transactions using one or more of processors 110 and provides the test transactions to memory controller 122. In response to receiving test transactions, memory controller 122 detects the test transactions and distinguishes the test transactions from regular memory transactions. The test transactions may be distinguished by any suitable method. For example, the operating system using different commands in the test transactions or the operating system may provide additional information or signals associated with the test transactions to memory controller 122.

In response to recognizing test transactions, memory controller 122 causes the test transactions, i.e. reads and writes, to be performed on portion 210a using control logic 128. In particular, memory controller 122 causes information to be stored to or read from portion 210a as directed by a transaction. Memory controller 122 ensures that test transactions do not cause information to be read from or written to cache 129.

During the tests on memory portion 210a, control logic 126 and cache control 128 in memory controller 122 cause regular memory transactions associated with portion 210a to be performed using cache 129. In particular, write transactions to addresses in portion 210a cause information to be written to the corresponding addresses in cache 129. Similarly, read transactions from addresses in portion 210a cause information to be read from the corresponding addresses in cache 129.

After completing the tests on portion 210a, the operating system notifies memory controller 122 that the tests are complete. Memory controller 122 causes the contents of cache 129 to be copied back to portion 210a in memory 130. During the interval where memory controller 122 is copying the contents of cache 129 into portion 210a, memory controller 122 ensures that any regular memory transactions to an address in portion 210a are handled appropriately. For example, if the transaction is a write transaction, memory controller 122 may cause the write associated with the transaction to be performed to both memory 130 and cache 129. Alternatively, memory controller 122 may cause the write to be delayed until the contents of cache 129 are copied back to portion 210a and then perform the write only to memory 130. For read transactions, memory controller 122 may perform the read from either memory 130 or cache 129, as appropriate, during this interval. Memory controller 122 may provide an indication to the operating system that contents of cache 129 have been copied back to portion 210a.

The operating system detects errors in portion 210a during testing. In response to detecting an error, the failing address or addresses in portion 210a may be logged and/or fixed, if possible. The operating system may avoid allocating or using failed locations in memory 130. In addition, the operating system may cause a system administrator to be notified of any failures.

The operating system may be designed to allow a system administrator to configure tests to memory 130 by allowing the administrator to select, for example, the time and frequency of tests, the amount of processing power to be allocated during tests, the particular portions of memory to test (e.g. frequently used portions), and the actions to be taken in the event of failures.

Memory portion 210a may be any suitable size of memory that is the same size or smaller than cache 129. For example, memory portion 210a may be of a size equal to one or more pages as defined by the operating system.

Figure 3:
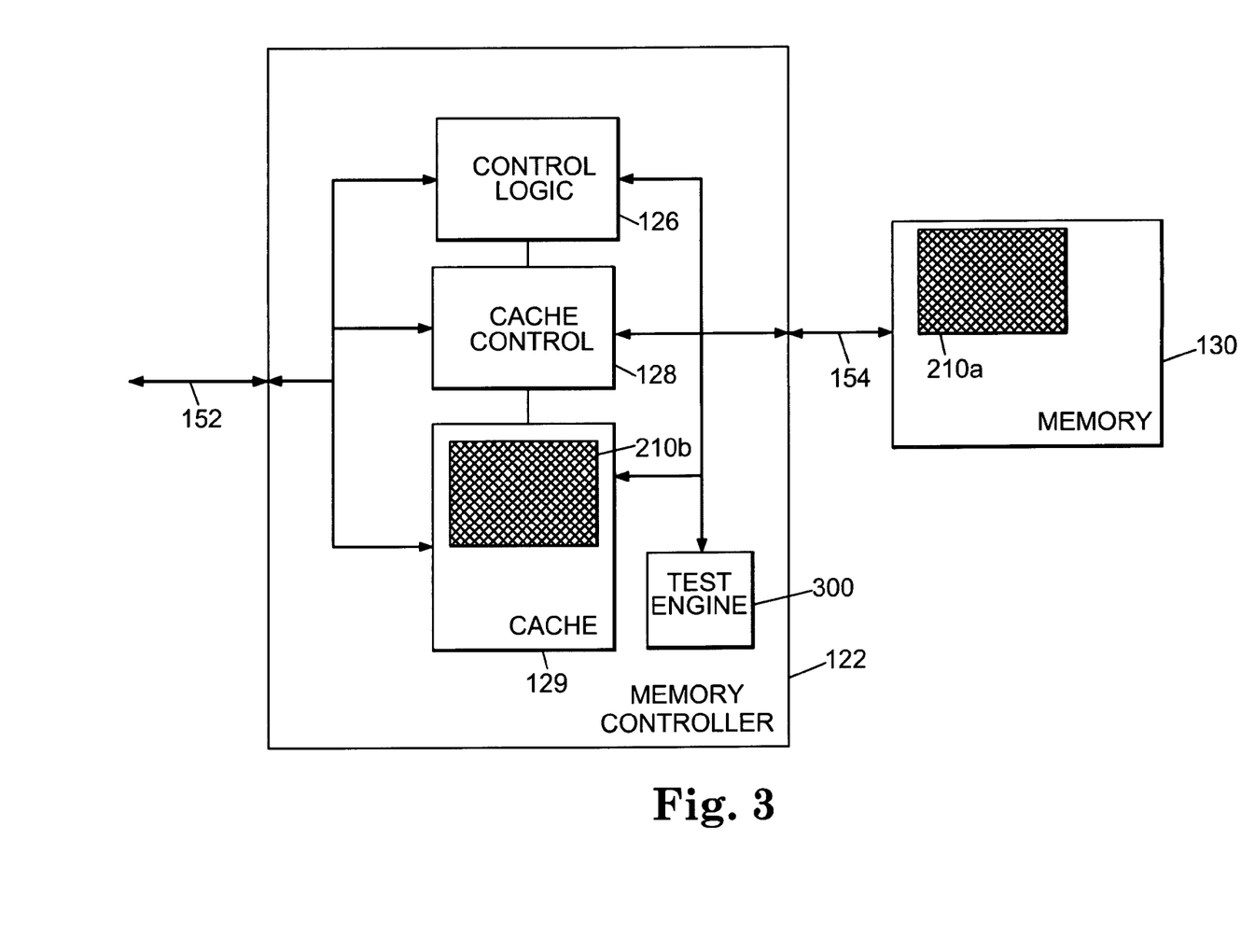
FIG. 3 is a block diagram illustrating a second embodiment of portions of the computer system shown in FIG. 1.

FIG. 3 is a block diagram illustrating a second embodiment of portions of computer system 100. In the embodiment of FIG. 3, test engine 300 causes tests to be performed on portion 210a using cache 129.

To test portion 210a, test engine 300 causes the contents of portion 210a to be copied into cache 129 as illustrated by the shaded portion 210b. To do so, test engine 300 selects portion 210a for testing and causes a command to be provided to control logic 126 and cache control 128 to indicate that portion 210a is to be tested. In response to receiving the command, cache control 128 causes portion 210a to be copied into cache 129. If capable, control logic 126 may detect, fix, and log errors found in portion 210a in response to copying the contents of portion 210a into cache 129.

During the interval where memory controller 122 is copying the contents of portion 210a into cache 129, memory controller 122 ensures that any memory transactions to an address in portion 210a are handled appropriately. For example, if the transaction is a write transaction, memory controller 122 may cause the write associated with the transaction to be performed to both memory 130 and cache 129. Alternatively, memory controller 122 may cause the write to be delayed until the contents of portion 210a are copied into cache 129 and then perform the write only to cache 129. For read transactions, memory controller 122 may perform the read from either memory 130 or cache 129, as appropriate, during this interval.

After the contents of portion 210a are copied into cache 129, test engine 300 generates test transactions, i.e. reads and writes, and causes the transactions to be performed in portion 210a.

During the tests on memory portion 210a, control logic 126 and cache control 128 in memory controller 122 cause regular memory transactions associated with portion 210a to be performed using cache 129. In particular, write transactions to addresses in portion 210a cause information to be written to the corresponding addresses in cache 129. Similarly, read transactions from addresses in portion 210a cause information to be read from the corresponding addresses in cache 129. Test engine 300 detects errors in portion 210a during testing. In response to detecting an error, the failing address or addresses in portion 210a may be logged and/or fixed, if possible. Memory controller 122 may avoid using failed locations in memory 130 using techniques such as aliasing. In addition, test engine 300 may cause the operating system to be notified of any failures.

After completing the tests on portion 210a, test engine 300 notifies control logic 126 and cache control 128 that the tests are complete. Cache control 128 causes the contents of cache 129 to be copied back to portion 210a in memory 130. During the interval where cache control 128 is copying the contents of cache 129 into portion 210a, memory controller 122 ensures that any memory transactions to an address in portion 210a are handled appropriately. For example, if the transaction is a write transaction, memory controller 122 may cause the write associated with the transaction to be performed to both memory 130 and cache 129. Alternatively, memory controller 122 may cause the write to be delayed until the contents of cache 129 are copied back to portion 210a and then perform the write only to memory 130. For read transactions, memory controller 122 may perform the read from either memory 130 or cache 129, as appropriate, during this interval. Memory controller 122 may provide an indication to the operating system that contents of cache 129 have been copied back to portion 210a.

Test engine 300 may comprise any combination of hardware and software.

In an alternative embodiment, the features described with respect to the operating system in FIG. 2 may be combined with the features described with respect to test engine 300 in FIG. 3. In particular, the operating system may direct and manage testing of portions of memory 130 using test engine 300.

In this embodiment, test engine 300 causes the contents of portion 210a to be copied to cache 129 in response to a command received by memory controller 122 from the operating system. The operating system may direct the type and/or number of tests for test engine 300 to perform on portion 210a or may simply initiate the tests. In response to detecting any errors, test engine 300 causes the operating system to be notified of the errors to allow the operating system to take appropriate actions.

The operating system may be designed to allow a system administrator to configure tests to memory 130 by allowing the administrator to select, for example, the time and frequency of tests, the amount of processing power to be allocated during tests, the particular portions of memory to test (e.g. frequently used portions), and the actions to be taken in the event of failures. As noted above, the operating system may be designed to allow a system administrator to configure tests to memory 130.

Figure 4A:
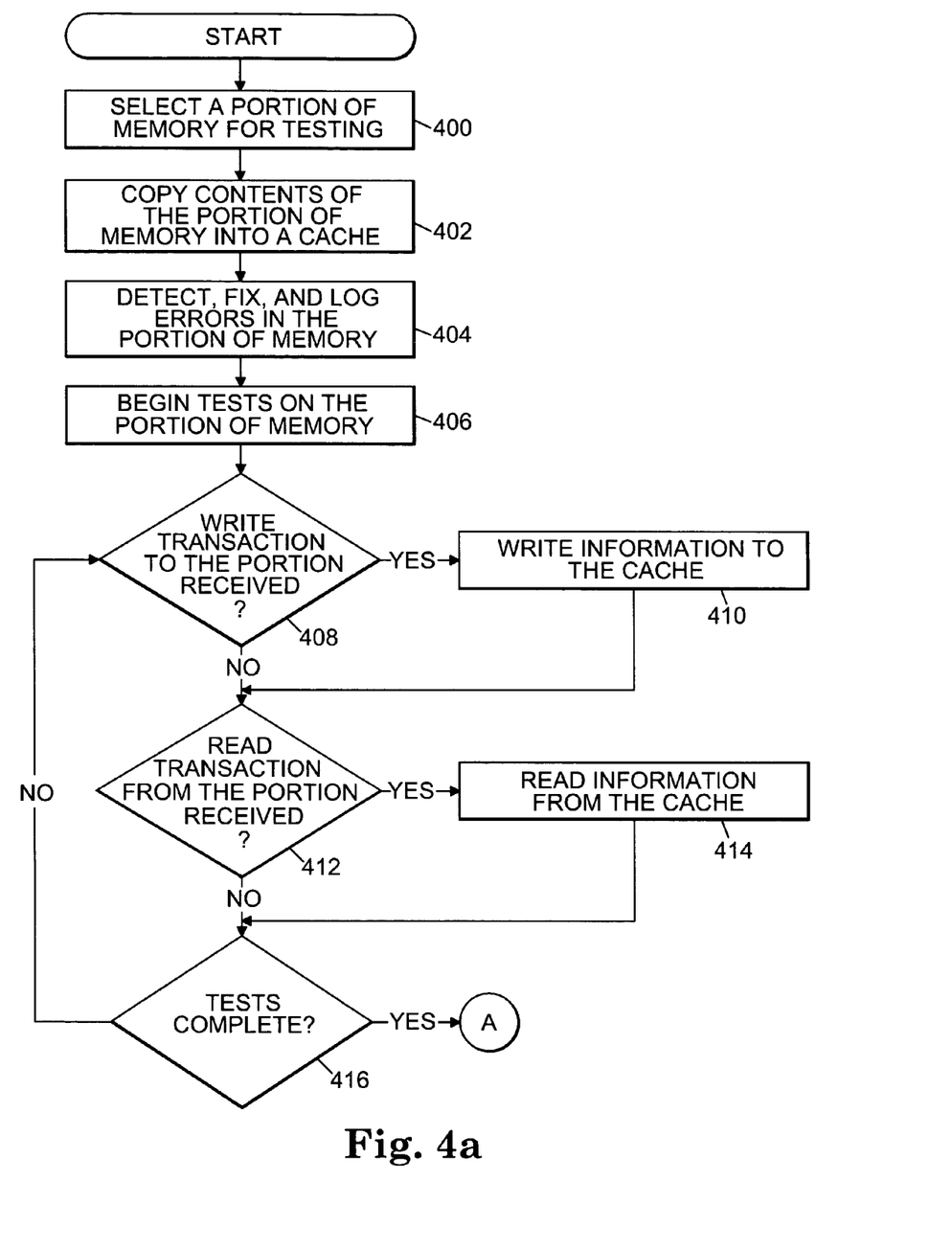
FIG. 4a is a first part of a flow chart illustrating an embodiment of a method for testing a memory during operation of a computer system using a cache.
Figure 4B:
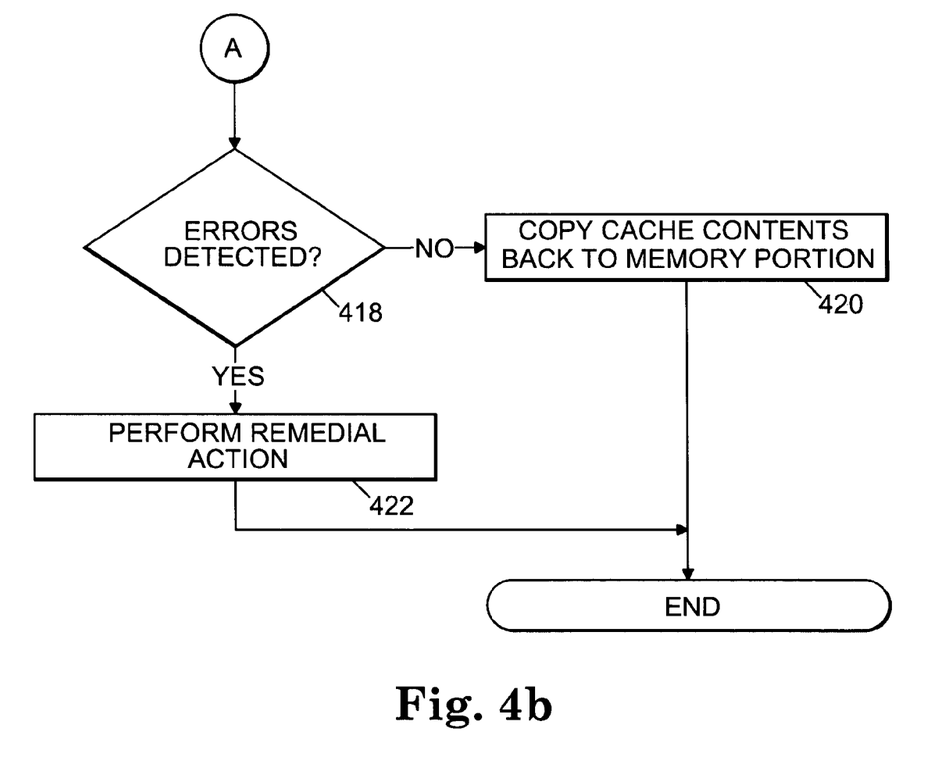
FIG. 4b is a second part of a flow chart illustrating an embodiment of a method for testing a memory during operation of a computer system using a cache.

FIGS. 4a and 4b are a flow chart illustrating an embodiment of a method for testing a memory during operation of a computer system using a cache. The embodiment of the method described in FIGS. 4a and 4b may be performed using an operating system, a test engine such as test engine 300, or a combination the operating system and the test engine. The method will now be described with reference to FIGS. 1, 2, and 3.

In FIG. 4a, portion 210a of memory 130 is selected for testing as indicated in a block 400. Contents from portion 210a of memory 130 are copied into cache 129 as indicated in a block 402. Memory controller 122, if capable, detects, fixes, and logs errors found in portion 210a as indicated in a block 404.

Tests are begun on portion 210a of memory 130 as indicated in a block 406. During the tests, a determination is made by memory controller 122 as to whether a write transaction associated with an address in portion 210a of memory 130 is received as indicated in a block 408. A write transaction may be received from one of processors 110 or from an I/O device 140. If a write transaction is received, then information associated with write transaction is written to the cache as indicated in a block 410. The information is not immediately written to memory 130. Rather, the information will be written to memory 130 subsequent to the tests when the contents of cache 129 are written back to portion 210a in memory 130.

Subsequent to the determination in block 408, a determination is made by memory controller 122 as to whether a read transaction associated with an address in portion 210a of memory 130 has been received as indicated in a block 412. A read transaction may be received from one of processors 110 or from an I/O device 140. If a read transaction associated with an address in portion 210a of memory 130 has been received, then information associated with the read transaction is read from cache 129 and provided to the requestor as indicated in a block 414. Because portion 210a is being tested, the information associated with the read transaction is not read directly from memory 130. Rather, the information is provided from cache 129.

Subsequent to the determination in block 412, a determination is made as to whether the tests on portion 210a are complete as indicated in a block 416. If the tests are not complete, then the method repeats the function described in block 408. If the tests are complete, then the method continues at point A in FIG. 4b.

Referring to FIG. 4b, a determination is made as to whether any errors have been detected in response to performing the tests as indicated in a block 418. If no errors were detected, then the contents of cache 129 are copied back to portion 210a in memory 130 as indicated in a block 420. If any errors were detected, then appropriate remedial action is taken as indicated in a block 422.

Figure 5:
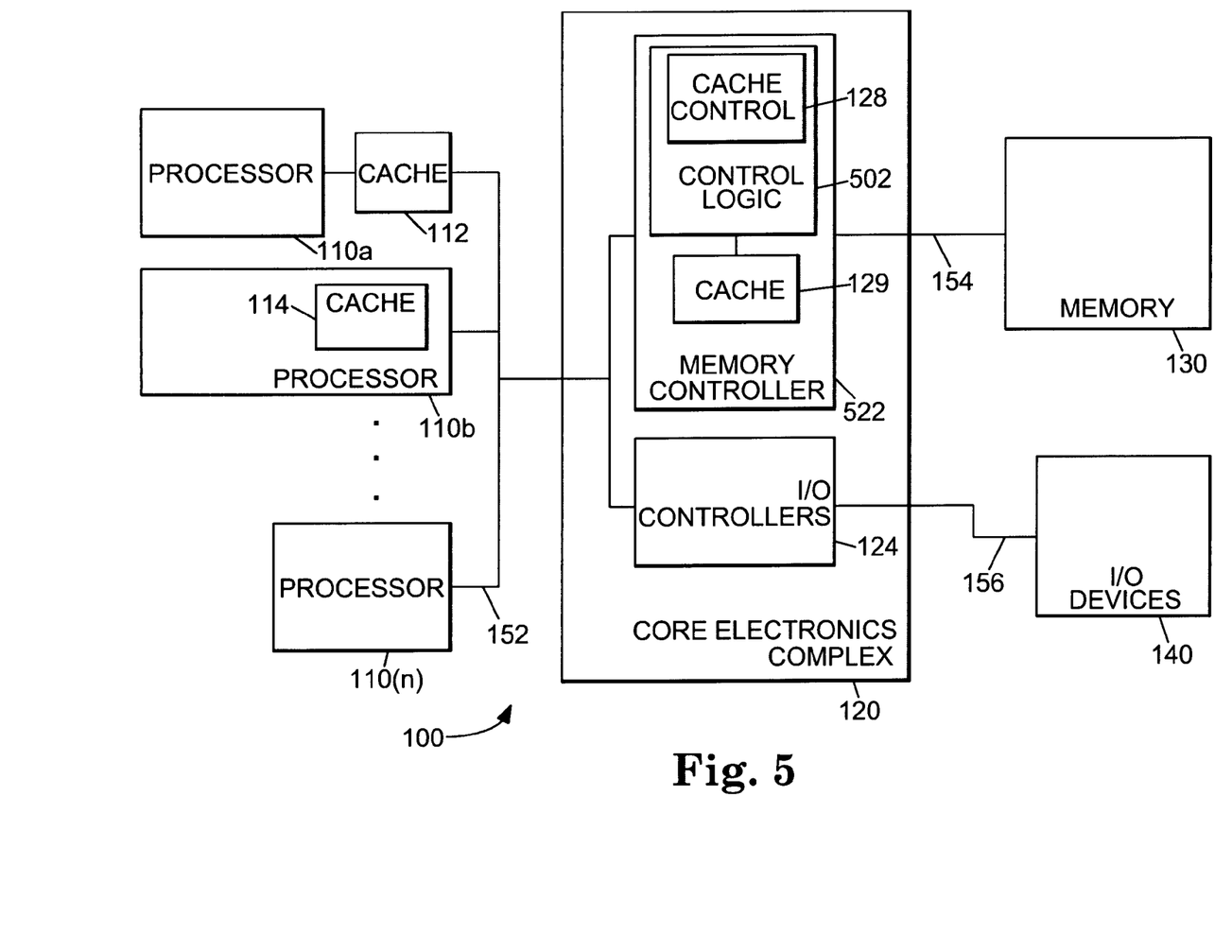
FIG. 5 is a block diagram illustrating an alternative embodiment of a computer system with a memory controller that includes a cache.

FIG. 5 is a block diagram illustrating an alternative embodiment of a computer system 100 with a memory controller 522 that includes cache 129. In FIG. 5, cache control 128 is includes a part of control logic 502 in memory controller 522. The embodiment of FIG. 5 operates in substantially the same way as the embodiments described in FIGS. 1, 2, 3, and 4, except that control logic 502 in memory controller 522 explicitly includes cache control 128.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A computer system comprising:
   a processor;
   a memory; and
   a memory controller coupled to the processor with a first connection and the memory with a second connection that is separate from the first connection;
   wherein the memory controller comprises a first cache separate from the memory and a cache control, wherein the cache control is configured to cause a portion of the memory to be copied from the memory into the first cache in the memory controller across the second connection, wherein the memory controller is configured to perform testing on the portion by providing a plurality of test transactions to the portion across the second connection subsequent to the portion being copied into the first cache, and wherein the cache control is configured to cause first information to be provided from the first cache in the memory controller to the processor across the first connection without accessing the memory during the testing of the portion in response to receiving a read transaction from the processor that includes an address corresponding to the portion of memory during the testing of the portion.

2. The computer system of claim 1 wherein the cache control is configured to cause the first information not to be read from the memory using the second connection during the testing of the portion of memory in response to receiving the read transaction.

3. The computer system of claim 1 wherein the cache control is configured to cause second information to be stored in the first cache using the first connection and without using the second connection in response to receiving a write transaction from the processor that includes an address corresponding to the portion of memory during the testing of the portion.

4. The computer system of claim 3 wherein the cache control is configured to cause the second information not to be stored in the memory using the second connection during the testing of the portion of memory in response to receiving the write transaction.

5. The computer system of claim 1 wherein the memory controller is configured to cause the first cache to be copied to the portion using the second connection subsequent to the testing of the portion of memory.

6. The computer system of claim 1 further comprising:
   an operating system executable by the processor;
   wherein the operating system is configured to cause the testing to be performed on the portion of memory subsequent to the portion being copied into the first cache.

7. The computer system of claim 6 wherein the operating system is configured to cause the testing to be performed on the portion of memory by providing the plurality of test transactions to the memory controller.

8. The computer system of claim 7 wherein the memory controller is configured to cause second information to be read from the portion in response to receiving at least one of the plurality of test transactions.

9. The computer system of claim 7 wherein the memory controller is configured to cause second information to be written to the portion in response to receiving at least one of the plurality of test transactions.

10. The computer system of claim 1 wherein the memory controller further comprises a test engine, and wherein the test engine is configured to cause the testing to be performed on the portion of memory subsequent to the portion being copied into the cache.

11. The computer system of claim 10 further comprising:
    an operating system executable by the processor;
    wherein the test engine is configured to cause the testing to be performed on the portion of memory in response to receiving a command from the operating system.

12. The computer system of claim 1 wherein the processor is coupled to a second cache.

13. A method performed by a computer system that includes memory, the method comprising:
    copying a portion of the memory into a cache in a memory controller that is separate from the memory using a first connection between the memory and the memory controller;
    providing a plurality of test transactions from the memory controller to the portion of the memory using the first connection subsequent to copying the portion into the cache;
    providing first information from the cache in the memory controller to a processor using a second connection between the processor and the memory controller without accessing the memory in response to receiving a read transaction from the processor that includes an address corresponding to the portion subsequent to copying the portion into the cache and while providing the plurality of test transactions to the portion of the memory; and
    copying the cache into the portion using the first connection subsequent to providing the plurality of test transactions to the portion.

14. The method of claim 13 further comprising:
    detecting an error in response to copying the portion into the cache; and
    fixing the error in the portion.

15. The method of claim 13 wherein at least one of the plurality of test transactions is configured to cause second information to be read from the portion of the memory.

16. The method of claim 13 wherein at least one of the plurality of test transactions is configured to cause second information to be written to the portion of the memory.

17. The method of claim 13 further comprising:
    detecting an error in response to providing the plurality of test transactions; and
    logging the error.

18. A computer system comprising;
    a processor;
    a memory;
    a memory controller coupled to the processor with a first connection and the memory with a second connection that is separate from the first connection and comprising a cache separate from the memory;

a means for causing a portion of the memory to be copied into the cache in the memory controller using the second connection;

means for causing a plurality of test transactions to be provided from the memory controller to the portion of the memory using the second connection subsequent to the portion of the memory being copied into the cache; and wherein the memory controller is configured to cause first information to be provided from the cache in the memory controller to the processor using the first connection without accessing the memory in response to receiving a read transaction from the processor that includes an address corresponding to the portion subsequent to the portion of the memory being copied into the cache and while the plurality of test transactions are being provided to the portion of the memory.

19. The computer system of claim 18 wherein the memory controller is configured to cause second information to be stored in the cache using the first connection and without using the second connection in response to receiving a write transaction from the processor that includes an address corresponding to the portion of the memory during testing of the portion.

* * * * *